United States Patent [19]

Frye et al.

[11] Patent Number: 5,737,496
[45] Date of Patent: Apr. 7, 1998

[54] ACTIVE NEURAL NETWORK CONTROL OF WAFER ATTRIBUTES IN A PLASMA ETCH PROCESS

[75] Inventors: Robert Charles Frye, Piscataway; Thomas Richard Harry, Trenton; Earl Ryan Lory, Pennington; Edward Alois Rietman, Madison, all of N.J.

[73] Assignee: Lucent Technologies Inc., Murray Hill, N.J.

[21] Appl. No.: 468,167

[22] Filed: Jun. 6, 1995

Related U.S. Application Data

[62] Division of Ser. No. 150,261, Nov. 17, 1993, Pat. No. 5,467,883.

[51] Int. Cl.$^6$ .................................................. G06F 15/18
[52] U.S. Cl. ......................... 395/23; 395/24; 395/903; 395/906
[58] Field of Search ...................... 395/23, 24, 906, 395/903

[56] References Cited

U.S. PATENT DOCUMENTS

| | | | |
|---|---|---|---|
| 5,052,043 | 9/1991 | Gaborski | 395/23 |
| 5,056,037 | 10/1991 | Eberhardt | 395/23 |
| 5,107,454 | 4/1992 | Niki | 395/24 |
| 5,114,233 | 5/1992 | Clark et al. | 356/354 |
| 5,119,468 | 6/1992 | Owens | 395/906 |
| 5,129,039 | 7/1992 | Hiraiwa | 395/24 |
| 5,175,678 | 12/1992 | Frerichs et al. | 395/906 |
| 5,259,064 | 11/1993 | Furuta et al. | 395/23 |
| 5,286,947 | 2/1994 | Clyde et al. | 219/121.83 |
| 5,297,237 | 3/1994 | Masuoka et al. | 395/23 |
| 5,408,588 | 4/1995 | Ulug | 395/23 |
| 5,479,575 | 12/1995 | Yoda | 395/23 |
| 5,559,690 | 9/1996 | Keeler et al. | 395/23 |

FOREIGN PATENT DOCUMENTS

| | | | |
|---|---|---|---|
| 44329A3 | 8/1991 | European Pat. Off. | G06F 15/80 |

OTHER PUBLICATIONS

C. D. Himmel et al., "A Comparison of Statistically-Based and Neural Network Models of Plasma Etch Behavior," IEEE/SEMI Intl. Semiconductor Manufacturing Science Symposium, 124–129 (Jun. 15–16, 1992).

S–S. Chen, "Intelligent Control of Semiconductor Manufacturing Processes," IEEE Int'l Conference on Fuzzy Systems, 101–108 (Mar. 8–12, 1992).

R. Shadmehr et al., "Principal Component Analysis of Optical Emission Spectroscopy and Mass Spectrometry: Application to Reactive Ion Etch Process Parameter Estimation Using Neural Networks," J. Electrochem. Soc., vol. 139, No. 3, 907–914 (Mar. 1992).

E.A. Rietman et al., "Active Neural Network Control of Wafer Attributes in a Plasma Etch Process," J. Vac. Sci. Technol. B vol. 11, No. 4, 1314–1316 (Jul./Aug. 1993).

(List continued on next page.)

Primary Examiner—George B. Davis
Attorney, Agent, or Firm—Scott J. Rittman

[57] ABSTRACT

The present invention is predicated upon the fact that an emission trace from a plasma glow used in fabricating integrated circuits contains information about phenoma which cause variations in the fabrication process such as age of the plasma reactor, densities of the wafers exposed to the plasma, chemistry of the plasma, and concentration of the remaining material. In accordance with the present invention, a method for using neural networks to determine plasma etch end-point times in an integrated circuit fabrication process is disclosed. The end-point time is based on in-situ monitoring of the optical emission trace. The back-propagation method is used to train the network. More generally, a neural network can be used to regulate control variables and materials in a manufacturing process to yield an output product with desired quality attributes. An identified process signature which reflects the relation between the quality attribute and the process may be used to train the neural network.

3 Claims, 5 Drawing Sheets

OTHER PUBLICATIONS

"Neural Networks for Control," Edited by W. Thomas Miller, III, Richard S. Sutton, and Paul J. Werbos, A Bradford Book, MIT Press (1990).

S. M. Weiss et al., "Computer Systems That Learn: Classification and Prediction Methods from Statistics, Neural Nets, Machine Learning, and expert Systems," 12, 13, 54–68, Morgan Kaufmann Publishers, Inc. (1991).

Panel on Plasma Processing of Materials, "Plasma Processing of Materials: Scientific Opportunities and Technological Challenges," 6, 13–36, National Academy Press, Washington, DC (1991).

R. G. Poulsen, "Plasma Etching in Integrated Circuit Manufacture –A Review*," J. Vac. Sci. Technol., 266–274, vol. 14, No. 1 (Jan./Feb. 1977).

J. Denker et al., "Large Automatic Learning, Rule Extraction and Generalization," Complex Systems 1, 877–922 (1987).

B. Widrow et al., "30 Years of Adaptive Neural Networks: Perception, Madaline, and Backpropagation," Proceedings of the IEEE, 1415–1442, vol. 78, No. 9 (Sep. 1990).

D.E. Rumelhart et al., "Parallel Distributed Processing: Explorations in the Microstructure of Cognition (vol. 1;Foundatins)," (A Bradford Book), 318–330, The MIT Press (1986).

E.A. Rietman et al., "Neural Networks That Learn," Algorithm –The Personal Programming Newsletter, 17–21 (May/Jun. 1990).

K. Hornik et al., "Universal Approximation of an Unknown Mapping and Its Derivatives using Multilayer Feedforward Networks," Neural Networks, 551–560, vol. 3 (1990).

R.R. Bowman et al., "Practical Integrated Circuit Fabrication," Section 9–Dry Etching, Integrated Circuit Engineering Corporation, 9–1 through 9–10 (1984).

A.K. Dewdney, "Computer Recreations," Algorithm, 3,4, 11–15 (Oct. 1992).

K.D. Schnelle et al., "A Real–Time Expert System for Quality Control," IEEE Expert, 36–42 (1992).

C. Barnes et al., "Applications of Neural Networks to Process Control and Modeling," Artificial Neural Networks, 321–326, vol. 1 (Jun. 1991).

Frye et al, "Back–propagation Learning and Nonidealities in Analog Neural Network Hardware", IEEE Transactions on Neural Networks, vol. 2, No. 1, Jan. 1991.

Rietman et al, "Neural Network Control of a Plasma Gate Etch: Early Stepsin Wafer–To Wafer Process Control", Fifteen IEEE/CHMT International Electronics Manufacturing Technology Symposium, 4–6 Oct. 1993.

FIG. 12

ACTIVE NEURAL NETWORK CONTROL OF WAFER ATTRIBUTES IN A PLASMA ETCH PROCESS

CROSS-REFERENCE TO RELATED APPLICATION

This application is a divisional of United States patent application Ser. No. 08/150,261, filed Nov. 17, 1993, now U.S. Pat. No. 5,467,883.

TECHNICAL FIELD

This invention relates to a method for use of neural networks to regulate control variables and materials in manufacturing processes such as those employing plasmas. The invention is illustrated by preferred embodiment in which a neural network, responsive to a plasma glow process, is used to control etch time in plasma etching.

BACKGROUND OF THE INVENTION

Plasma processes are important in the aerospace, solar energy, paper, textile industries as well as in the electronics industry for the fabrication of integrated circuits and optoelectronic devices. See National Research Council, *Plasma Processing of Materials*, National Academy Press, Washington, D.C., 1991. For example, plasmas are used both to etch and to deposit thin film layers on integrated circuit substrates.

A plasma is an ionized gas in which concentrations of positive and negative ions are almost equal. The plasma may also contain free radicals which are electrically neutral yet highly reactive. A plasma is formed by introducing a desired gas into a reactor or chamber and applying a radio frequency (RF) field to the chamber. The gas introduced is typically chosen to participate in the chemistry of the desired process, as for example chlorine gas in etching polysilicon in the fabrication of integrated circuits. The RE field causes electron collisions with neutral or charged species which then emit radiation producing a glow-discharge or emission.

Plasma etching is the selective removal of material by the reactive free radicals or ions generated within the plasma. In many cases, the plasma etching process is superior to wet etching techniques (where material is etched by liquid chemicals) in terms of exactness of the etching and process control. See generally, R. G. Poulsen, "Plasma Etching in Integrated Circuit Manufacture—A Review," *J. Vac. Sci. Tech.*, Vol. 14, No. 1, 266–274 (Jan./Feb. 1977).

Plasma processes are generally difficult to control. See, e.g., National Research Council at 34–35. For example, the plasma etching process must be continuously monitored to compensate for variations. One cause of variation in the process is the aging of the reactor. The etch time for a freshly cleaned reactor chamber is different than the etch time for a reactor that has been in production use for a time. Also, wafers having different pattern densities etch differently. Such changes necessitate continual inspection to maintain the quality of the product. Based on the inspection results, a decision is made for the etch time for the next lot. However, the requirement for continuous human intervention to account for the effects of machine aging and cleaning leads to run-to-run variations in wafer attributes or characteristics between lots. Thus, there is a need for an accurate control mechanism to adjust the etch times between lots without continuous human intervention.

SUMMARY OF THE INVENTION

The present invention uses neural networks to govern or regulate input control variables and materials used in manufacturing processes to yield an output product with desired quality attributes. The method is particularly useful in controlling plasma processes, and it avoids many of the costs, delays and inconsistencies associated with prior methods. In the preferred embodiment, a neural network controller monitors a portion of the optical emission trace during the plasma etching process and computes the plasma etch endpoint time based on this observation. The network is trained directly with production data measurements of product quality using the back-propagation technique. An automated etch time control process offers advantages in terms of greater uniformity, higher yields and lower costs.

BRIEF DESCRIPTION OF THE DRAWINGS

Other features and advantages of the invention will become apparent from the following detailed description taken together with the drawings in which.

DETAILED DESCRIPTION

I. Introduction

Figure 1:
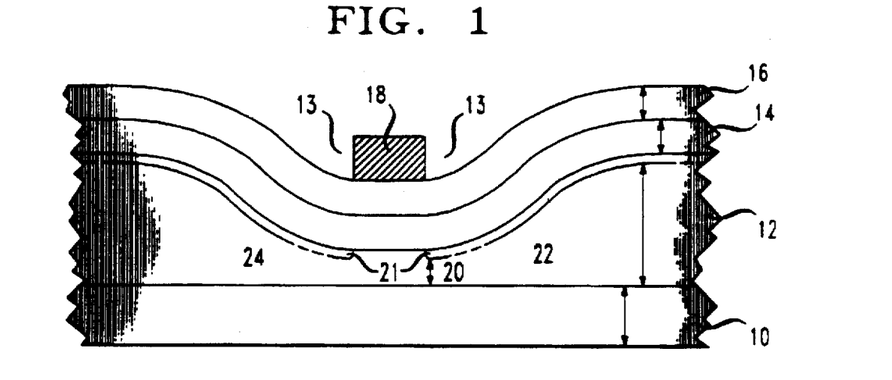
FIG. 1 illustrates a plasma etching step in fabricating an integrated circuit.

FIG. 1 illustrates typical use of the plasma etching process as one step in fabricating a MOS transistor. Silicon wafer substrate 10 is covered by oxide layer 12. Oxide layer 12 is then covered with polysilicon layer 14 and tantalum silicon layer 16. Oxide layer 12, typically silicon diode, has a well 13 in it. A layer of photoresist material 18 is applied to a portion of well 13, and tantalum silicon layer 16 and polysilicon layer 14 are etched away.

In etching away polysilicon layer 14, it is important that all of polysilicon layer 14 be removed. However, in etching polysilicon layer 14 completely a portion 21 of oxide layer 12 will inevitably be etched. In the etching process, a critical quality attribute is remaining oxide thickness 20 in the source region 22 and drain region 24 which determines the characteristics of these regions. Remaining oxide thickness 20 is a function of the etch time, i.e. the period for which the wafer is exposed to the plasma.

Figure 2:
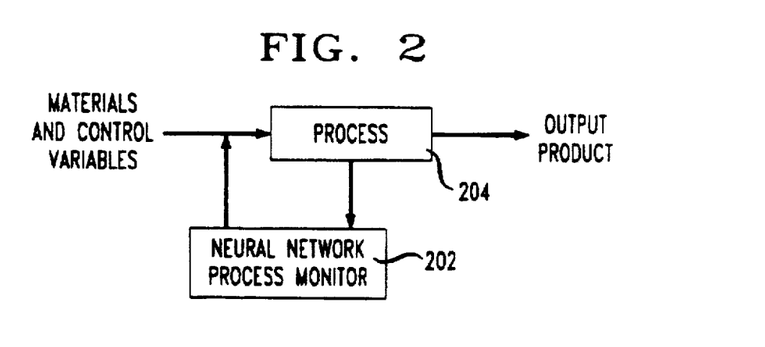
FIG. 2 illustrates a neural network process monitor for regulating a manufacturing process.

FIG. 2 presents an illustrative embodiment of the present invention in which a neural network is advantageously incorporated into process monitor 202 which regulates or governs the materials and control variables input into process 204 to produce a desired quality attribute in the output product. Section II presents an illustrative embodiment of the invention in which the plasma etch time in the fabrication of integrated circuits is controlled by a neural network process monitor which uses a portion of the trace of the optical emission to produce a desired oxide thickness on a wafer. An overview of neural network operation and the preferred back-propagation training technique are discussed in Section III.

II. A Neural Network Controller

A trace or record may generally be defined as a measurement over time of a specific variable or function. In the preferred embodiment a portion of the trace of the optical emission spectrum from the plasma glow, measured at a specified wavelength as a function of time, is used as a process signature. A process signature reflects, or has embedded in it, information related to quality attributes and to the process itself as well as information about factors which make the process difficult to control. The optical emission trace reflects information directly related to the chemistry of the plasma and information regarding the concentration of the material etched away. Indirectly, its behavior contains information about aging of the machine, pattern density of the wafers, non-ideal fluctuations in gas flow, pressure, RF power, etc. This information embedded in the optical trace is adequate for neural network mapping or training to predict and control the ideal etch time for a desired oxide thickness. See W. T. Miller, R. S. Sutton and P. J. Werbos, *Neural Networks for Control*, MIT Press, Cambridge, Mass. (1990) for a collection of papers on neural networks for control.

Other process signatures may also be identified and used to train a neural network and to control a process. In some cases, for example, traces of the input control variables and materials, such as power, temperature, pressure, etc., may be process signatures. In these cases, a set point, i.e. a desired or fixed value, is generally selected for each of the inputs. The inputs will fluctuate around these set points. The variations may reflect the progress of the process in producing an output with specified quality attributes, and thus these traces may be process signatures which can be used to train the neural network and to control the process.

Figure 3:
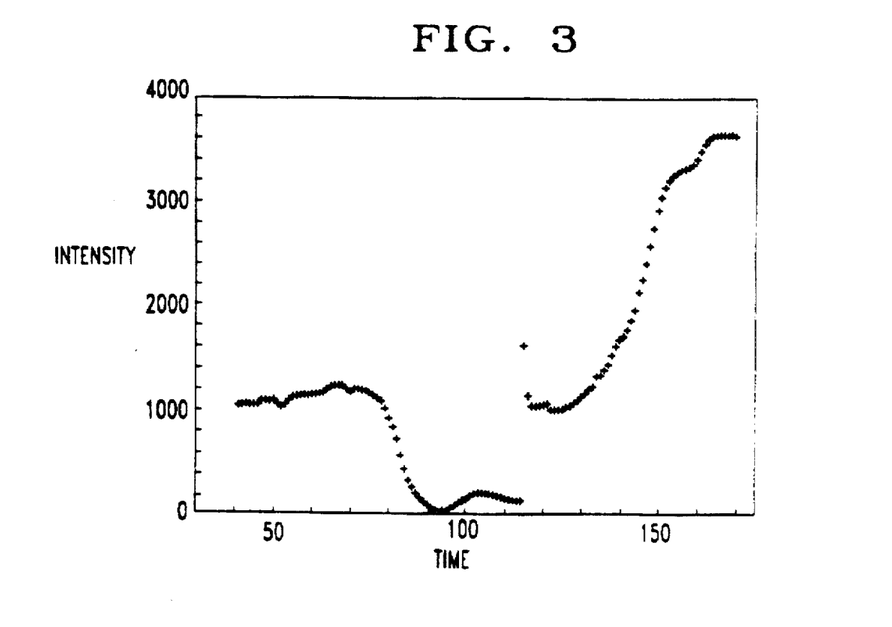
FIG. 3 illustrates a plot of a typical emission trace.

FIG. 3 is a plot of a typical emission trace which in the preferred embodiment indicates the amount of chlorine gas in the plasma. The chlorine gas emission was measured at a wavelength of 837 nanometers. The time units are based on the frequency of data collection which, in this case, is approximately 1.9 sec. per unit. This trace is for a two-step gate etch in which the first etch (from t=25 to t=115) is a TaSi etch and the second is for a polysilicon etch. During the polysilicon etch step some of the underlying oxide in the exposed source and drain regions will inevitably be etched. The amount etched is dependent on the selectivity of the polysilicon etch conditions toward the oxide, and is a parameter of critical concern in the device fabrication. At time unit t=52 the instrument is auto-zeroed, which normalizes the trace data. The auto-zeroing or normalizing step is important because the trace has information not only about emission intensity but also about the last cleaning of the chamber. Thus, the auto-zero step adjusts the signal to allow for fogging of the optical windows as the machine ages. After the TaSi etch, the wafer is transferred to a second chamber for the polysilicon etch under a different chemistry. The spike at t=115 occurs at the turn on of the RF power for the polysilicon etch. One current method of etch end-point detection is to observe the time at which the trace crosses a threshold, and then to etch for an additional time which is a predetermined fraction of the initial etch time. In the example shown in FIG. 3, there is a threshold point at about 82 time units. This represents the end-point of the TaSi etch and the time from 82 to 115 is the TaSi over-etch time. The threshold point at about 145 signals the end-point of the polysilicon etch and the time from 145 to 170 is the over-etch time for the polysilicon etch.

Since the primary quality parameter of the process is the thickness of the oxide remaining in the source and drain regions after the etch, trace data for the polysilicon etch will be used to compute the ideal etch time for that process. The neural network controller illustratively uses as input twenty-four measurements of the polysilicon etch's emission trace. The first seven measurements typically are skipped to avoid the spike at turn-on. The next twenty-four data points typically constitute the first one-third of the total etching time. This ensures that the input data can be collected well before the etch is completed. This input is used to train the neural network to compute the optimum total etch time to obtain a target oxide thickness in the source and drain regions.

Figure 4:
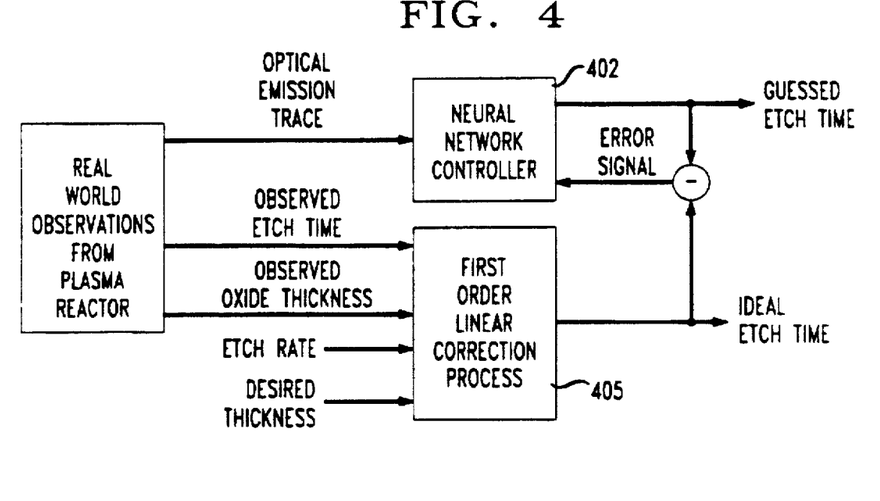
FIG. 4 illustrates a block diagram system for training a neural network.

FIG. 4 is an illustrative diagram of the method of training the neural network. In the preferred embodiment, the neural network 402 is a 24×5×1 architecture (i.e. 24 input nodes, 5 hidden nodes and 1 output node) and trained with the back-propagation technique (see Section III below). Results from a production database may be used for the training. Since such results will show a spread in observed oxide thicknesses, it becomes necessary to compute for each run in the database the time that would have been required to achieve the optimal result. The oxide thickness and etch time from each run can be corrected, using the known rate of oxide etching in the polysilicon etch chamber, to compute a first-order correction on the etch time. This corrected etch time is then used as the target for training the neural network. Thus, the network is trained directly with measurements of the attribute which determine product quality.

The first order linear correction process 405 computes the ideal etch time. If the oxide thickness $T_{obs}$ and the etch time $t_{obs}$ from some real world observations are known, then given the etch rate $E_R$ and the desired thickness $T_{des}$ we can compute an ideal etch time for this desired thickness:

$$t_{ideal} = t_{obs} + \frac{(T_{obs} - T_{des})}{E_R}.$$

The difference between the ideal etch time and the neural network's guessed or estimated etch time is fed back to the neural network as an error signal from which the neural network can compute new values in the weight matrices. In all of the examples in the database, the observed etch time is close to the ideal one, and the first-order corrections are small. It is important to keep in mind, however, that this kind of linear correction is only valid for making these small corrections near the end of the etch process. The earlier steps in the etch sequence, which encounter different layers and transient effects at turn-on time, are highly nonlinear and less well-behaved. These steps will be accounted for in an actual experimental database.

In training a neural network, as in any statistical learning tool, the data set may be partitioned into two sections. One section is used for training and the other section is used for testing. The preferred embodiment started with 650 examples, from which 50 were separated for testing, and 600 were used to train the network. Of these 650 examples the pattern density of the product being etched varied by as much as 50%. This pattern density information is, of course, also embedded in the trace file so it was not explicitly considered. It is assumed in such an approach that there is enough information in the trace file to accurately predict the correct etch time and that pattern density need not be explicitly included in the network's input. The training consisted of repeated random selection of examples from the training set and back-propagating the resulting errors to update the connection matrices.

Figure 5:
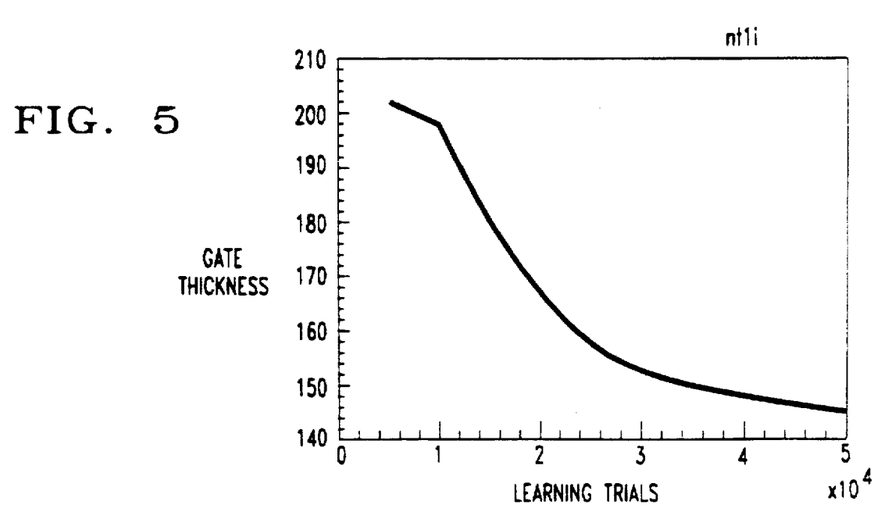
FIG. 5 illustrates the average resulting gate thickness as a function of the number of learning trials for the neural network.

In the preferred embodiment, the training was stopped after every 1000 trials and the performance of the network was tested with the test set. These results are shown in FIG. 5. The oxide thickness before etch was 208 A. Since the network before training has very small weights, its initial output was near zero etch time, so the resulting oxides in the test data would have been unetched. After repeated training the network guesses improved, until after 50,000 training cycles the computed etch times were resulting in an average oxide thickness of 145 A, compared with a target value equal to the value for human assisted methods of 151 A. More importantly, the current, human assisted method results in a standard deviation of 15.1 A in the oxide thicknesses. The neural network showed an equivalent spread of 15.0 A.

Figure 6:
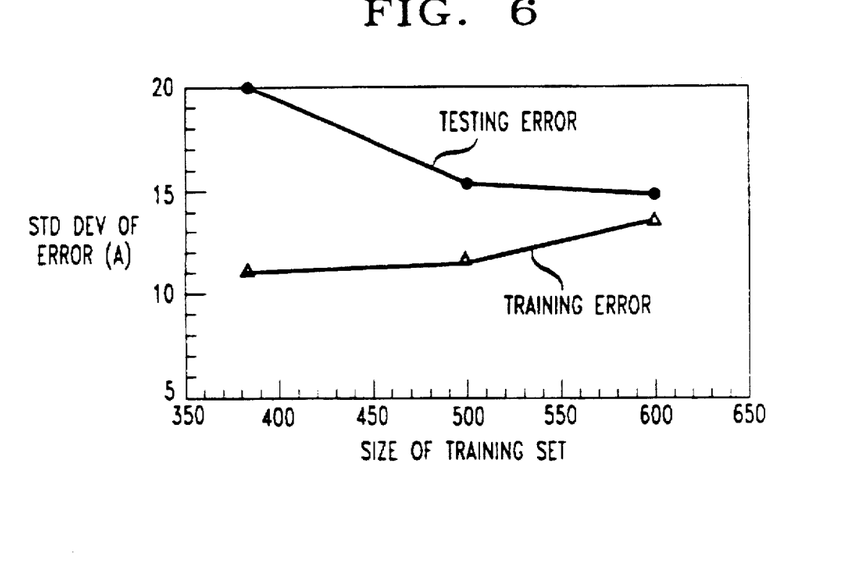
FIG. 6 illustrates the performance of the neural network as a function of data base size.

There are various methods to improve the neural network learning performance. See J. Denker et at., "Large Automatic Learning, Rule Extraction, and Generalization," *Complex Systems*, Vol. 1, 877–922 (1987). The most common is to adjust the complexity of the network. But there is a trade-off in the complexity and the error. A network that is too complex will essentially build a lookup table with the training data and perform poorly on testing data. The network in the illustrative embodiment has been optimized for a minimum complexity and while still achieving a low error. It should also be apparent that as the amount of training data increases the testing error should decrease. FIG. 6 is a plot which demonstrates this. The figure shows that as the training set size increases, the standard deviation of the network error decreases. Thus, a tighter process control over the oxide thickness remaining after the plasma etch may be expected.

Figure 7:
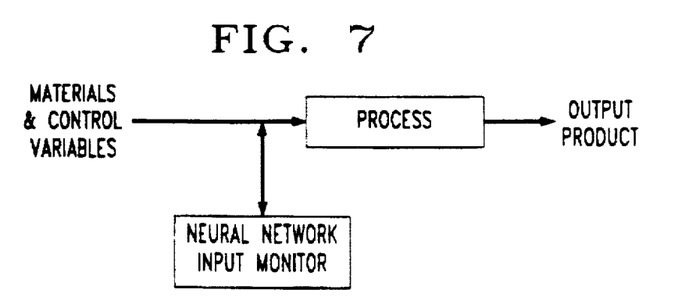
FIG. 7 illustrates a neural network controller which monitors input control variables and materials to regulate a manufacturing process.

FIG. 7 illustrates another embodiment of the invention. In this embodiment, the neural network is again trained with production data measurements of quality attributes. In this embodiment, the process signatures monitored by the neural network may be portions of the traces of a plurality of input control variables and materials. For example, RF power, gas flow and pressure could be advantageously used to compute the total etch time. As with the preferred embodiment, it is only required that the neural network monitor some physical characteristics or manifestations of the complete manufacturing process which reflect or have embedded in them information sufficient to assure process quality as measured by attributes of the output product.

Figure 11:
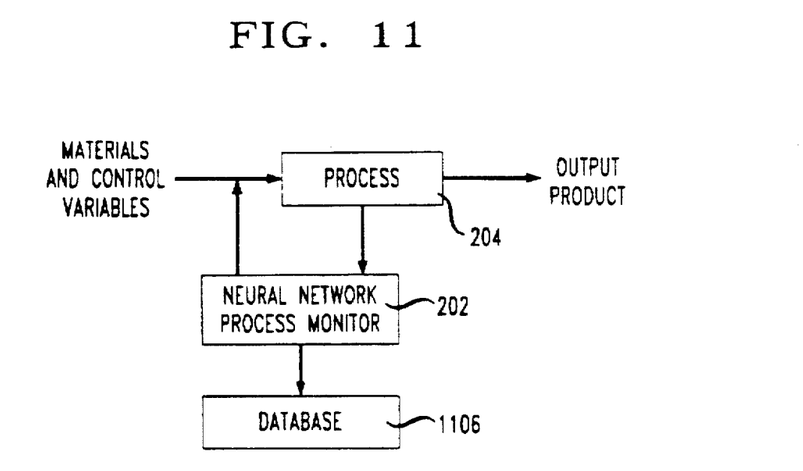
FIG. 11 illustrates a neural network process monitor and database for regulating a manufacturing process.

FIG. 11 illustrates a further embodiment of the invention in which neural network process monitor 202 advantageously uses input information from database 1106 as well as input from the process signature to regulate the material and control variables input to process 204 to produce an output product with the desired quality attributes. Database 1106 may be any information storage system, but preferably any such system should be capable of dynamically accessing information in real time in response to interrogations from neural network process monitor 202. The additional information in database 1106 can result in improved network training and control of process variables.

In the context of the plasma etching process described above, database 1106 may contain information regarding process signatures (other than optical emission trace) and parameters (e.g. number of chips per wafer; RF power, DC bias and etch times from previous lots; and statistical data relating to observed oxide thickness in previous lots). More generally, the type of information in database 1106 will vary depending on the type and variety of input materials and control variables as well as the process signatures and process variables used for a given process.

Figure 12:
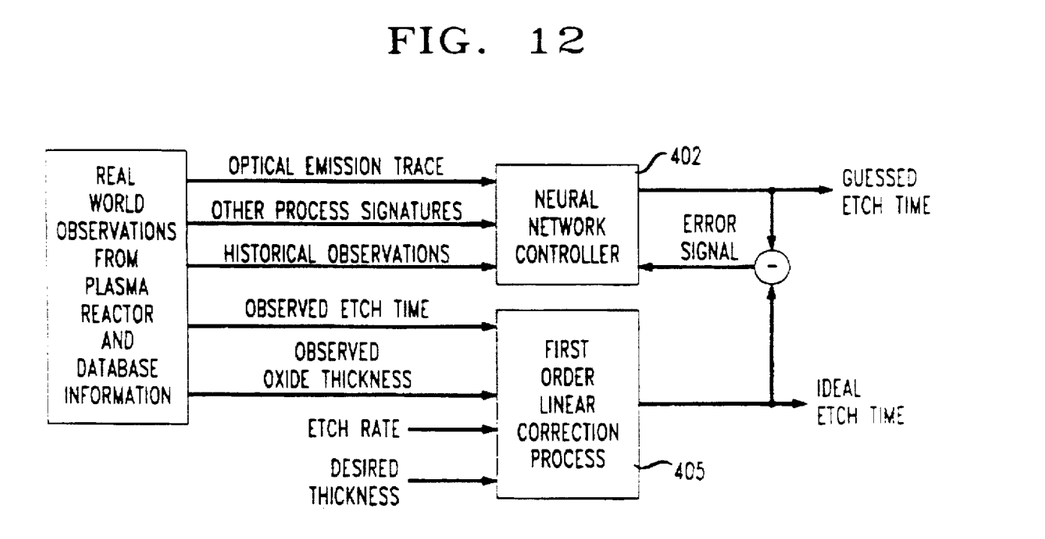
FIG. 12 illustrates a block diagram system for training a neural network using database information.

As noted above, the information in database 1106 may be used to train the neural network as show. The training process is similar to that as described for and shown in FIG. 4. FIG. 12 illustrates that other process signatures as well as observations and statistics of previous and current lots may be used to train the neural network.

Apart from the practical aspects of making better etch end-point detectors for plasma etching, this technique demonstrates the ability of a neural network to extract useful information from complex data. The physics needed to monitor the progress of a plasma etching procedure based on the optical emission trace alone would probably be prohibitively difficult. However, the neural network simply learns by trial and error to extract the appropriate information. Those skilled in the art will recognize that this technique can be applied to many similar control problems provided the data in the process monitor has embedded within it the necessary information.

III. Neural Networks

Neural networks are loosely modeled after biological neural networks. The underlying physical models for these networks have developed from early attempts to model the behavior of their biological counterparts. These networks generally consist of layers of active elements, neurons, coupled together by variable strength connection matrices simulating the synapses found in biological networks. Layered networks of interconnected, nonlinear neurons are finding increasing use in problems such as pattern recognition, signal processing, systems identification, speech processing and robotics and machine control. Their most powerful advantage is their ability to adaptively learn to emulate the behavior of other nonlinear systems. This adaptive learning process is based on a trial and error approach in which the network is gradually modified until it exhibits the desired characteristics. For a historical review of neural network techniques, see B. Widrow & M. A. Lehr, "30 Years of Adaptive Neural Networks: Perception, Madaline, and Backpropagation," *Proc. IEEE*, Vol. 78, No. 9, 1415–1442 (Sep. 1990).

Figure 8:
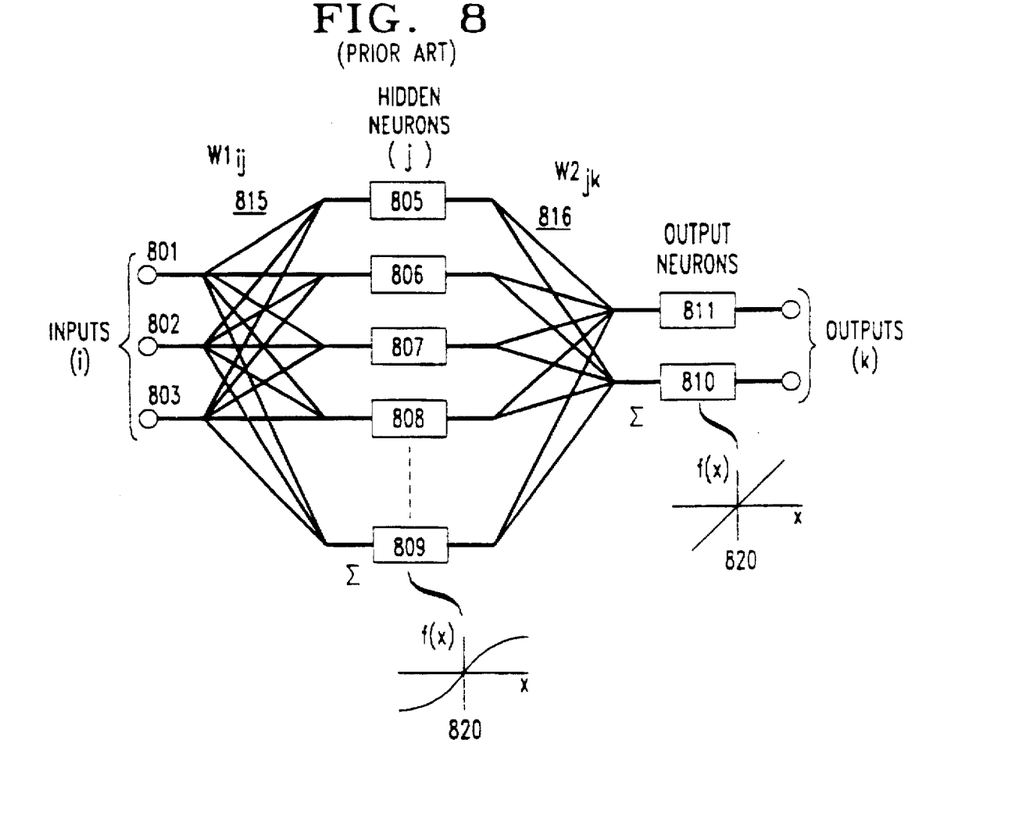
FIG. 8 illustrates a schematic of a feedforward neural network.

FIG. 8 is a schematic of a typical feedforward neural network in which neurons 805–811 (also called nodes) are indicated by rectangles and synaptic connections 815–816 are indicated by the lines connecting each node. A distinguishing characteristic of these networks is the absence of feedback. Signals flow in parallel paths through them, connecting only to nodes further downstream. In analog electronic hardware versions of these networks, this highly parallel architecture allows them to perform at a high equivalent computational rate. Software networks, based on this physical model, do not realize the same benefits of parallelism, but can still exploit the ability of these networks to adaptively learn. The algorithms that have been developed to design neural networks that do particular computational tasks apply equally well to both hardware and software networks.

Layers of neurons that are not directly connected to the output are often called hidden layers. Only one hidden layer, nodes 805–809, is shown in FIG. 8. Each neuron acts as a summing node, collecting a weighted sum of all the signals in the previous layer. In addition, each has associated with it response curve 820 called its activation function. The hidden neurons are usually chosen to have a sigmoidal, or step shaped, activation function. The hyperbolic tangent, arc tangent and Fermi functions are examples of mathematical functions that are commonly used in software networks, all of which have the correct shape and give comparable results. Their sigmoidal shape is important. The nonlinearity can be used by the adaptive network to construct nonlinear output responses. However, their saturating nature keeps the response of the overall network nicely bounded, preventing the uncontrolled behavior that can result from other nonlinear methods like polynomial curve fitting. The hyperbolic tangent function is illustratively used in the preferred embodiment. The activation function for output neurons 810–811 in the last layer, on the other hand, is usually linear. This gives an unlimited dynamic range, allowing the network to generate arbitrarily large output signals.

The interconnections between the layers of neurons are variable connection strength coefficients in a weight matrix. In a software network, the physical architecture shown in FIG. 8 is described by the equation $$o_k = \sum_j W2_{jk} \tanh\left(\sum_i W1_{ij} i_i\right) \quad (1)$$

This relation describes $o_k$, the linear output of the kth neuron in the output layer, for a set of inputs, $i_i$. Equations for networks with more hidden layers would contain an additional summation and nonlinear activation function for each additional layer. The matrix W1 is the input-to-hidden layer matrix, and the W2 matrix is the hidden-to-output matrix.

Figure 9:
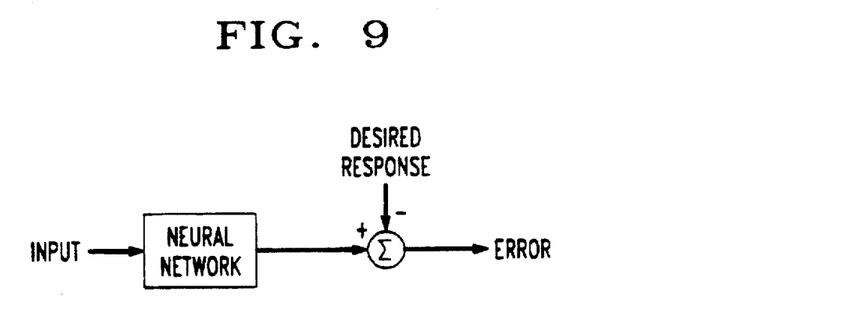
FIG. 9 illustrates the adaptive procedure for adjusting the weight matrix elements.

Notice that apart from the number of layers and the number of neurons in each layer, the basic architecture and elements within the network are generic. One network of this kind looks more or less like any other. The function of the network is not determined by its active elements, the neurons, but rather by the interconnections among them. The basic idea, shown schematically in FIG. 9, is to adjust the values of the individual connections $W1_{ij}$ and $W2_{jk}$ to minimize the mot mean square (rms) error in the output. This process is done gradually—i.e. the changes to the connections after each individual trial are small. With each change, however, the network more closely approximates the desired response.

A widely used adaptive method to compute the changes in the connection matrices is the back-propagation of errors technique. D. E. Rumelhart, G. E. Hinton & R. J. Williams, "Learning Internal Representations by Error Propagation," in D. E. Rumelhart, J. L.'s & the PDP Research Group, *Parallel Distributed Processing*, Vol. 1, 318–330, MIT Press, Cambridge, Mass. (1986). See also, E. A. Rietman and R. C. Frye, "The Back Propagation Algorithm for Neural Networks," *Algorithm*, Vol. 1.4, 17, May/June 1990. The training of a neural network by the back-propagation technique consists of adjusting the elements of several matrices in order to minimize the error between the network output and the target response. This method is a generalization of the delta rule, see Rumelhart, supra, at 321, and is based on a gradient descent optimization technique. It attempts to minimize the mean-squared error in the output of the network, as compared to a desired response. For a network having multiple outputs, the rms error is given by $$E = \left(\sum_k (o_k - t_k)^2\right)^{1/2}, \quad (2)$$

where $t_k$ and $o_k$ are the target and the output values for the $k^{th}$ component of the vectors. If the network is time invariant, then its output will depend only on its inputs, $i_i$, and the current value of the connection weight matrices, $W1_{ij}$ and $W2_{jk}$, as in Equation 1. For a particular input vector the error is determined by the values of the weighting coefficients that connect the network. The method used in the adaptive procedure is to change these connections by an amount proportional to the gradient of the error in weight space, i.e. for a given weight coefficient $w_{ij}$, $$\Delta w_{ij} \propto -\frac{\partial E}{\partial w_{ij}} \quad (3)$$

This technique results in lowering the average error as the weight matrices in the network evolve. In layered networks of the kind considered, the changes in the weights after each trial are proportional to the error itself. This leads to a system that settles to a stable weight configuration as the errors become small. However, the changes become zero only for zero gradient of the error in weight space. This zero can represent either a true global minimum or only a local one, but from a practical standpoint this gradient descent algorithm generally results in useful solutions.

Figure 10:
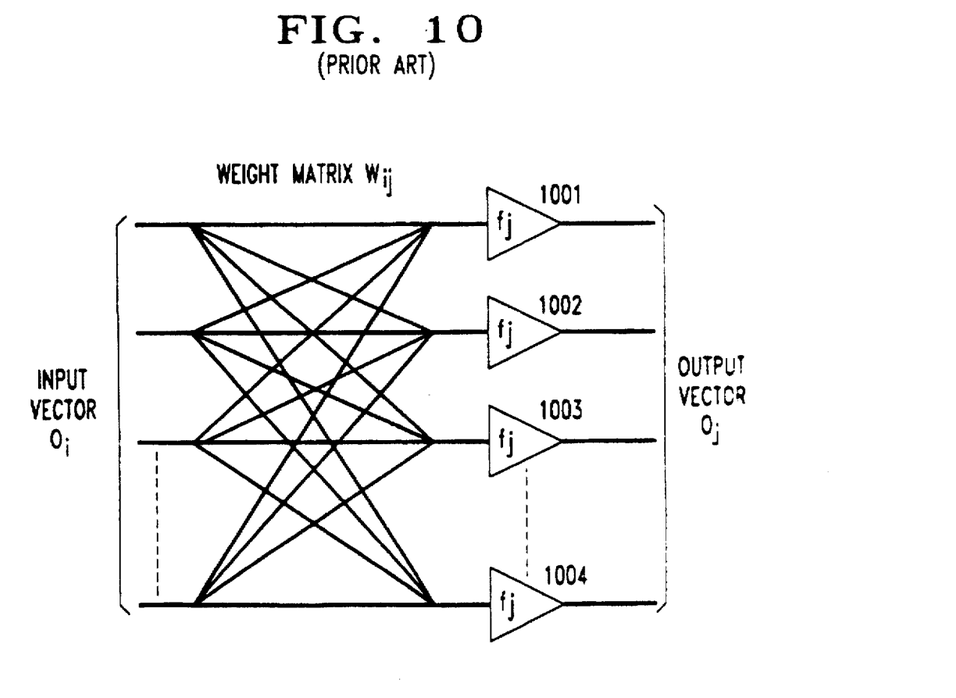
FIG. 10 illustrates a generic layer in a feed forward network.

The generalized delta role is a simple computational algorithm derived from Equation 5. FIG. 10 shows a generic layer within a network. In this representation, the output of the layer is a vector of signals $o_j$. Its input vector, $o_i$, may itself be an output from a preceding layer. Output vector $o_j$ may, in turn, provide input to the next layer. Neurons 1001–1004 have an activation function $f_j$ and are coupled to the input vector by a weight matrix $w_{ij}$. The net input to each neuron is given by $$net_j = \sum_i o_i w_{ij} \quad (4)$$

and the output vector is given by $$o_j = f_j(net_j). \quad (5)$$

For the layer in the figure, the weight changes are $$\Delta w_{ij} = \eta o_i \delta_j. \quad (6)$$

In this relationship, $\eta$ is the learning rate, and is the constant of proportionality implicit in Equation 3. If the layer in question is an output layer, then $\delta_j$ is given by $$\delta_j = (t_j - o_j) f'_j(net_j), \quad (7)$$

where $t_j$ is the target, or desired, output vector and $f'_j$ denotes the differential of the neuron's activation function with respect to the input signal. For linear output neurons, $f'_j$ is just a constant (usually unity). However, if the layer is hidden inside the network, it is not immediately apparent what its target response should be. In this case, $\delta_j$ is computed iteratively using $$\delta_j = f'_j(net_j) \sum_k \delta_k w_{jk} \quad (8)$$

where $\delta_k$ and $w_{jk}$ refer to the layer immediately after the one in question (i.e. to the right of the layer in FIG. 7). So, for example, in the network described by Equation 1, $\delta_j$ for the hidden layer is computed using $\delta_k$ from the output layer, the matrix $W2_{jk}$ and $f'_j = \mathrm{sech}^2$. In practice, the input is first propagated forward through the network. The weight changes are first computed in the last layer, using Equations 7 and 8, and then working backwards through the network layer by layer using Equations 6 and 8.

Thus, neural networks are, in essence, a nonparametric nonlinear learning algorithm. No assumptions are made about the populations of the variables and no assumptions are made about the functional relations of the variables. The only assumption is that there is a cause and effect relation between the inputs and the outputs which can be learned by the neural network. S. W. Weiss and C. A. Kulokowski, *Computer Systems That Learn: Classification and Prediction Methods from Statistics, Neural Nets, Machine Learning, and Expert Systems*, Morgan Kaufman, San Mateo, Calif. (1991); K. Hornik, M. Stinchcombe and H. White, *Universal Approximation of Unknown Mapping and its Derivatives Using Multilayer Feedforward Networks*, Neural Networks, Vol. 3, 551–560 (1990).

Since there is in fact such a cause and effect relation between the operations of the inspection of the oxide thickness and adjusting the etch time for the next etch, neural networks could play a role in the integrated circuit fabrication process. By identifying the process signature that reflects the relation between oxide thickness and overetch time, information about the process signature can be used to train the neural network and to make predictions about the etch time adjustment as demonstrated by the description of the preferred embodiment in Section II above. The neural network controller as described produced a standard deviation of oxide thickness comparable to human assisted methods. Thus, the neural network controller offer advantages on terms of greater uniformity of product quality resulting in higher yields and lower costs in the manufacturing process.

We claim:

1. A method comprising the steps of:

training a neural network by repetitively, performing an individual run of a process, measuring, during said run, a selected process signature of said process, applying a representation of said process signature to the input nodes of said neural network to obtain a guessed value of a process variable of said process at the output of said neural network, and updating said neural network in response to said guessed value of said process variable and an ideal value of said process variable for said individual run, and thereafter performing a subsequent run of said process, the value of said process variable during said subsequent run being determined from the output of the trained neural network that results when a representation of said process signature, measured during said subsequent run, is applied to said neural network input nodes, wherein said ideal value of said process variable is a value that would yield a particular quality attribute value for the process during said individual run, and wherein said selected process signature is indicative of a process parameter which is interdependent with said quality attribute value.

2. The method of claim 1 wherein said process parameter is a product of said process.

3. The method of claim 1 wherein said process parameter is a control variable of said process.

* * * * *